United States Patent
Tuyls et al.

(10) Patent No.: US 7,554,337 B2
(45) Date of Patent: Jun. 30, 2009

(54) SEMICONDUCTOR DEVICE, METHOD OF AUTHENTIFYING AND SYSTEM

(75) Inventors: Pim Theo Tuyls, Eindhoven (NL); Thomas Andreas Maria Kevenaar, Eindhoven (NL); Petra Elisabeth De Jongh, Eindhoven (NL); Robertus Adrianus Maria Wolters, Eindhoven (NL)

(73) Assignee: NXP B.V., Eindhoven (NL)

( * ) Notice: Subject to any disclaimer, the term of this patent is extended or adjusted under 35 U.S.C. 154(b) by 415 days.

(21) Appl. No.: 10/557,262

(22) PCT Filed: May 17, 2004

(86) PCT No.: PCT/IB2004/050716
§ 371 (c)(1), (2), (4) Date: Nov. 17, 2005

(87) PCT Pub. No.: WO2004/105125
PCT Pub. Date: Dec. 2, 2004

(65) Prior Publication Data
US 2007/0040256 A1  Feb. 22, 2007

(30) Foreign Application Priority Data
May 26, 2003 (EP) ................... 03101515

(51) Int. Cl.
G01R 27/00 (2006.01)
G01R 31/26 (2006.01)

(52) U.S. Cl. ...................... 324/600; 324/765

(58) Field of Classification Search ........... 324/600, 324/525, 719, 764, 765; 361/783, 820; 716/4
See application file for complete search history.

(56) References Cited

U.S. PATENT DOCUMENTS

| 5,146,499 A * | 9/1992 | Geffrotin ............ 713/172 |
| 5,325,442 A | 6/1994 | Knapp |
| 6,047,068 A | 4/2000 | Rhelimi et al. |
| 6,078,494 A | 6/2000 | Hansen |
| 6,161,213 A | 12/2000 | Lofstrom |
| 6,567,916 B1 * | 5/2003 | Terao et al. ............ 713/176 |
| 6,998,688 B2 * | 2/2006 | De Jongh et al. ......... 257/414 |
| 7,167,077 B2 * | 1/2007 | Grassl .................. 340/5.61 |
| 7,525,330 B2 * | 4/2009 | De Jongh et al. ......... 324/763 |

(Continued)

FOREIGN PATENT DOCUMENTS

WO   WO 98/18102   4/1998

(Continued)

OTHER PUBLICATIONS

U.S. Appl. No. 60/439,986.

(Continued)

*Primary Examiner*—Vincent Q Nguyen
*Assistant Examiner*—Hoai-An D Nguyen

(57) ABSTRACT

The semiconductor device of the invention includes a circuit and a protecting structure. It is provided with a first and a second security element and with an input and an output. The security elements have a first and a second impedance, respectively, which impedances differ. The device is further provided with a measuring unit a processing unit and a connection unit. The processing unit transform any first information received into a specific program of measurement. Herewith a challenge-response mechanism is implemented in the device.

20 Claims, 3 Drawing Sheets

U.S. PATENT DOCUMENTS

2002/0095587 A1* 7/2002 Doyle et al. ................. 713/186
2004/0117662 A1* 6/2004 Ong ........................... 713/202
2004/0205341 A1* 10/2004 Brickell ...................... 713/168
2005/0021993 A1* 1/2005 De Jongh et al. ............ 713/200
2005/0051351 A1* 3/2005 De Jongh et al. ........... 174/52.1

FOREIGN PATENT DOCUMENTS

WO　　WO 03/007231　　1/2003
WO　　WO 03/046986　　6/2003

OTHER PUBLICATIONS

U.S. Appl. No. 60/434,520.
U.S. Appl. No. 60/434,829.

* cited by examiner

SEMICONDUCTOR DEVICE, METHOD OF AUTHENTIFYING AND SYSTEM

The invention relates to a semiconductor device provided with a circuit comprising an active element which circuit is present at a side of a substrate and is covered by a protecting structure, which semiconductor device is further provided with:
- a first and a second security element each comprising a local area of the protecting structure and an input and an output and having a first and a second impedance respectively,
- measuring means to measure actual values of the first and second impedance, and
- connection means for transmittal of the measured actual values of the security elements.

The invention also relates to a method of checking the authenticity of a semiconductor device by a reader, which comprises or has access to a memory comprising reference values of the security elements of the semiconductor device, which method comprises the steps of
- measuring the actual values of the security elements, thereby generating second information;
- transmitting said actual values
- checking the authenticity by comparison of the actual values with the reference values read from the memory, and
- recognizing the authenticity only if the difference between the actual values and the reference values is smaller than a prescribed threshold value.

The invention further relates to a method of initialization of the semiconductor device.

The invention further relates to a system comprising such a semiconductor device and a reader that comprises or has access to a memory comprising reference values of the security elements of the semiconductor device, which system is suitable for executing the above mentioned method.

Such a device, such a method and such a system are described in the non-prepublished application WO IB02/05050 (PHNL010859). The semiconductor device therein preferably comprises a so-called security layer that includes particles which are distributed inhomogeneously aver the circuit. The presence of the particles provides an impedance to a local area of the protecting structure, which is in particular a passivation structure that includes a passivation layer. Such particles may be different and their concentration may be different, the—first—impedance of one local area in the first security element may and probably will differ from the—second—impedance of another local area in the second security element. These impedances can be measured, in a manner comparable to capacitors, resistors, sensors, inductors, magnetoresistive sensors and the like. The impedances may be measured under various conditions, particularly at different frequencies.

In order to use the actual values for identification purposes, an initial value of the security elements is determined on initialization of the semiconductor device, preferably during or directly after manufacturing. These initial values are stored as reference values in a memory. Such a memory may be present in a suitable reader, or it may have a suitable electrical connection, for instance by telephone, internet or cable connection. In order to check the authenticity of the semiconductor device, or to establish the identity of the semiconductor device and a user thereof, the actual value of the security elements can then be compared with the reference values as available in the memory. In such a manner, the security elements provide a security feature that is based on a physical implementation of a measure. Furthermore, the security elements can be used to check whether any person has against the desire of the seller of the semiconductor device, removed the passivation structure in order to modify the circuit. Such a modification must be excluded in order to prevent that any person can get access to data or even cash of another person.

Investigations relating to the described semiconductor device and the described system have shown that the security can be further improved. That is particularly desired in cases that the reference values are stored at a different location than the actual values, i.e. that the memory containing the reference values is not part of the semiconductor device itself. This improvement is desired, in view of the fact that electronic systems are connected nowadays to a plurality of other systems, and in view of the fact that if the reader has access only to the memory, use will be made of communication systems commonly available for the exchange of information regarding the reference values and/or the actual values.

It is a first object of the present invention to provide a semiconductor device of the kind mentioned in the opening paragraph that is suitable for improved security.

It is a second object of the present invention to provide an improved method of authentication or establishment of identity.

The first object is achieved in that the connection means are able to receive first information from a reader and to transmit second information being generated on the basis of measurements of the actual values; that the measuring means are able to measure the actual values in a manner established on the basis of the first information; and that processing means are present to establish a program of measurement of the set of actual values of the security elements on the basis of the first information, and to generate the second information on the basis of the actual values as measured.

The second object is achieved in that the method comprises the steps of:
- providing first information comprising instructions to measure actual values of the security elements in a specific manner;
- transmitting said fist information from the reader to the semiconductor device;
- establishing a program of measurement of a set of actual values of the security elements on the basis of the first information;
- measuring the actual values of the security elements according to the program of measurement
- generating second information on the basis of the actual values as measured;
- transmitting the second information from the semiconductor device to the reader,
- checking the authenticity or establishing the identity by comparison of the second information with reference information, said comparison taking place with the reference information and/or the second information in comparable formats, and
- recognizing the authenticity or the identity only if the difference between at least a number of elements included in the second information and in the reference information in their comparable formats is smaller than a prescribed threshold value.

According to the invention, the first and the second information is not a simple list of the actual values. The first information is a protocol describing a specific measurement. There can be—and preferably are—a plurality of implementations of the first information for one and the same semiconductor device. The second information is a sequence of the actual values, wherein both the sequence and the actual values may be different each time that an authenticity check is made. The actual values may be different in that these are measured under different physical conditions, the order is different or different security elements are measured. Furthermore, it may well be that first information is sent to the device several times within one authenticity check. It is observed that there is no need that the first information prescribes the measurement of the actual values of all the security elements.

Although the first information can be considered to be a protocol prescribing a specific measurement, it is not necessary that this corresponds one-to-one to the program of measurement. The security mechanism is based on a comparison of the second information with the reference information. The measurement of the actual values of the security elements is an essential part of the information, as this provides security based on physically and/or chemically implemented features. However, there is no need to know which specific actual value corresponds to which part of the information.

The device of the invention allows implementation of a mechanism that is known per se in cryptography as challenge-response mechanism. In such mechanisms a verifier, here acting through the reader, challenges the prover, here the semiconductor device, to answer a certain question, thereby verifying the identity or authenticity of the prover. In order words, the challenge-response mechanism is integrated in a semiconductor device that can be—and preferably is—used for another main function. The measurement in the device of the invention is enabled in that impedances are measured. The measurement can thus be implemented with standard passive structures and interconnects.

The primary benefit of the invention, as compared to the device and method of the non-prepublished application, is that the number of challenges to be sent to the semiconductor device (or the number of variations of the first information) is increased very much. By virtue thereof each challenge need be used only once. It is expected that the number of possible challenges will exceed 10,000 and preferably 100,000 or even more. The checking of the identity or authenticity of the semiconductor device includes a step of comparison with reference information. This reference information is preferably stored in basically the same format as the second information. This may even lead to too much information to be stored. In order to limit the necessary storage capacity in a database, it is envisaged that not all challenges and corresponding responses (e.g. first and second informations) will be stored, but only a certain subset which may be chosen arbitrarily or specifically. The choice of the challenge to be sent to the semiconductor device can be a random choice. However, it is not excluded that different subsets can be identified in the collection of first informations. Some subsets may be chosen so as to have a specific function, for instance for calibration or for extended security. One very specific subset is for instance a simple list of the actual vales as measured under different conditions.

In order to enable such challenge-response mechanism, the processing means are provided. They generally take the form of a microprocessor, and they may be an independent part of the semiconductor device, but the may also be integrated together with any microprocessor that is present to execute any main function of the device.

Generally, a switching function to select the desired security elements and a driver unit suitable for driving the individual security elements will be present. These functions may be integrated in the processing means or in the measuring means or divided over both means. The switching function can be realized with transistors, or alternatively with pin diodes, MEMS-switches and the like. The driver unit usually comprises a matrix structure so as to address the individual elements.

The specific measuring means will depend on the specific type of impedance to be measured, which includes the capacity and the inductance, and which presuppose variation of the effective dielectric constant and variation of the magnetic susceptibility, respectively. If the capacitance is measured, measuring means as known from the field of fingerprint sensors may be used. Such measuring means are, for example, the totality of drive means and sensing means as known from U.S. Pat. No. 5,325,442. Alternatively, especially if the number of security elements is relatively small, these may be measured one after the other with a conventional circuit wherein the sensing means are placed in parallel with the impedance. If the inductance is measured, sensing means such as described in the non-prepublished applications U.S. 60/434,520, U.S. 60/434,829, U.S. 60/439,986 (PHUS020611, PHUS020612, PHUS030014) may be used. It will be apparent that also both the effective dielectric constant and the magnetic susceptibility may be varied, so as to obtain a larger variation of the impedances.

It is being understood, in the context of this application, that the measurement of the actual values includes the determination of any parameter indicative thereof, or representing it, or corresponding to it. As even a dielectric constant can be measured at different frequencies with different results, it will be clear that this actual value need not be a value that can be obtained independently anywhere else. However, it is a value measured actually, and if the measurement is repeated under the same conditions, it must provide the same actual value.

The connection means, and the steps of transmitting information from the reader to the semiconductor device, do not presuppose any specific kind of connection. The transmittal and receival of information may occur wireless, through a galvanic connection, through capacitive coupling or with opto-electric coupling means. Methods to realize the transmittal and receival and the corresponding means are known per se. Examples of means are antennas, inductors, bond pads together with solder or metal balls, glue or bond wires, capacitive plates, laser diodes, glass fibers. The connection means furthermore include any active elements such as amplifiers and rectifiers to enable the transmittal and receival.

In a particularly suitable embodiment the first information also specifies the conditions under which the actual value of an individual security element is to be measured. Such physical conditions include the frequency at which the measurement takes place, the application of an external field. The measuring means are provided with units to enable setting of these conditions. If the frequency is varied, this may be realized by using a frequency reference signal, such as the clock of the device, and a programmable frequency divider. A similar approach can be realized in the time domain. Here a voltage or current profile is defined in the time domain. This signal is used to excite the selected security elements. The measurement is then defined as the peak value in a certain interval. The external field may be provided using any means present on the semiconductor device. Alternatively, it may involve a specific communication to the reader in which such means are implemented.

In a particularly preferred embodiment, the processing means include a processor that is implemented with a hash function. A hash function compresses an arbitrary-length input to a fixed-length output and has the avalanche property that changing one bit in the input flips roughly half the bits in the output. Such hash-functions are furthermore attractive in that the hash function is not invertible.

This implies that it is not possible to choose the first information in order to obtain a predefined selection of security elements, measuring order and physical conditions.

Nevertheless, a comparison between the second information and the reference information is possible, since the reference information is generated using the same hash functions.

From *Science*, 297(2002), 2026-2030 the use of a hash function for protection of data is known per se. The known system operates on the basis of laser pulses. The advantage of the device of the invention is the ability to implement the protection in a single semiconductor device. The reader may be very simple and should be provided with contacts, same memory and a processor to implement a protocol for providing first information to the semiconductor device. Therefore, the system can be implemented in semiconductor devices for a large variety of applications and without the need to include optical components.

The use of hash functions is particularly suitable for the security elements, —more particularly the security layer—as used in the device of the invention, in that only the first information can be chosen freely, so that the effective measurement of the values of the impedance cannot be specified. Further, as hash functions have a randomizing effect, any linearity in the measurement is taken away.

In order to increase the security level, the actual values as measured are given a conversion treatment so that the second information is not a simple list of the actual values. Examples of conversion treatments include combining actual values by multiplication, addition, subtraction, modifying individual actual values with one or more integers or other numbers; applying a security function, such as a hash function to the actual values; repeating or adding numbers so that the size of the second information does not correspond to the number of actual values that are measured. It is clear that many more conversion treatments can be envisaged. Preferred is the application of a security function, particularly a hash function.

In an even further embodiment, the processor is provided with a plurality of hash functions and conversion treatments; and the first information is provided with a subset, which determines which of the hash functions and conversion treatments will be applied to the first information and/or to the actual values as measured.

The variation of the impedances is preferably realized laterally over the circuit. This has as a first advantage that the variation can be provided easily with known processes, such as the application of layers by wet-chemical deposition, the carrying out of local irradiation or plasma treatments to effect chemical modification, the patterned and multiple provision of layers so as to create structures and differences in thicknesses. A second advantage hereof is that the protecting structure may have a passivation function. Preferably, it includes a separate passivation layer of known material and composition, such as silicon nitride. A third advantage is that the protecting structure may be chosen such that it is not transparent and that it cannot be removed without damage to the underlying circuit.

It is herein observed for reasons of clarity that the protecting structure need not cover the complete semiconductor device, although this appears to be most practical. It is furthermore observed that it is not necessary that the protecting structure is the top layer of the device. Structures such as bond pads, inductors and transmission lines may well be present on top of the protecting structure. As the protecting structure will have relatively large dimensions, as compared to individual active elements, such as diodes and transistors, it is preferable to provide it in the top layers of an interconnect structure. It is also observed that the protecting structure may include the packaging material of the device.

The protecting structure preferably comprises a security layer with particles that are distributed inhomogeneously. Such a layer can be provided with sol-gel processing, such as for instance known from WO99/65074. The included particles may be of any kind, and may be amorphous and crystalline in nature. Particularly preferred are particles having a dielectric constant substantially different from that of the matrix material in the sol-gel coating, as well as particles having a magnetic susceptibility. Soft magnetic materials, and particularly ferrites are preferred herein.

The protecting structure of the semiconductor device of the invention preferably comprises a plurality of security elements, each security element comprising a local area of the protecting structure and an input and an output, and having an impedance, the impedances of the individual security elements depending on the location of the security element in the protecting structure. In this manner, the number of possible challenges increases very much.

The semiconductor device is suitable for integration in any apparatus and any carrier. Suitable examples of apparatus are computers, mobile communication apparatus such as mobile phones, apparatus for reproduction of digital data, such as those suitable for digital video discs (DVD) and the like. Suitable carriers include smartcards, identification tags, security paper, magnetic, optical and other record carriers.

It is preferred, with reference to the method of the invention, that at least one error correction step is included. Such error correction can take place in any position in the chain following the actual measurement. Error correction mechanisms are known per se. In the case that the semiconductor device is implemented in a hand-held device with wireless communication, such as a mobile phone or a chip card, it is preferred for reasons of energy efficiency that the error correction is—at least primarily—done in the reader. An alternative to extensive error correction is that in case of doubt as to whether or not accept the device, further challenges are executed. If the deviation in the executed challenges were systematic, an embedded sensor could check any background effects, such as temperature, background electric or magnetic field, and the like.

The invention also relates to a method of initialization of the semiconductor device. The initialization of the semiconductor device provides an initialization reader, or particularly a central database, with a collection of first informations and corresponding second informations, that are stored as reference informations.

These and other aspects of the invention will be further described with reference to the figs., in which.

The figs. are schematically drawn and not to scale, and identical reference numbers in different figs. refer to corresponding elements. It will be clear to the person skilled in the art that alternative yet equivalent embodiments of the invention are possible within deviating from the true inventive concept, and that the scope of the invention will be limited by the claims only.

Figure 1:
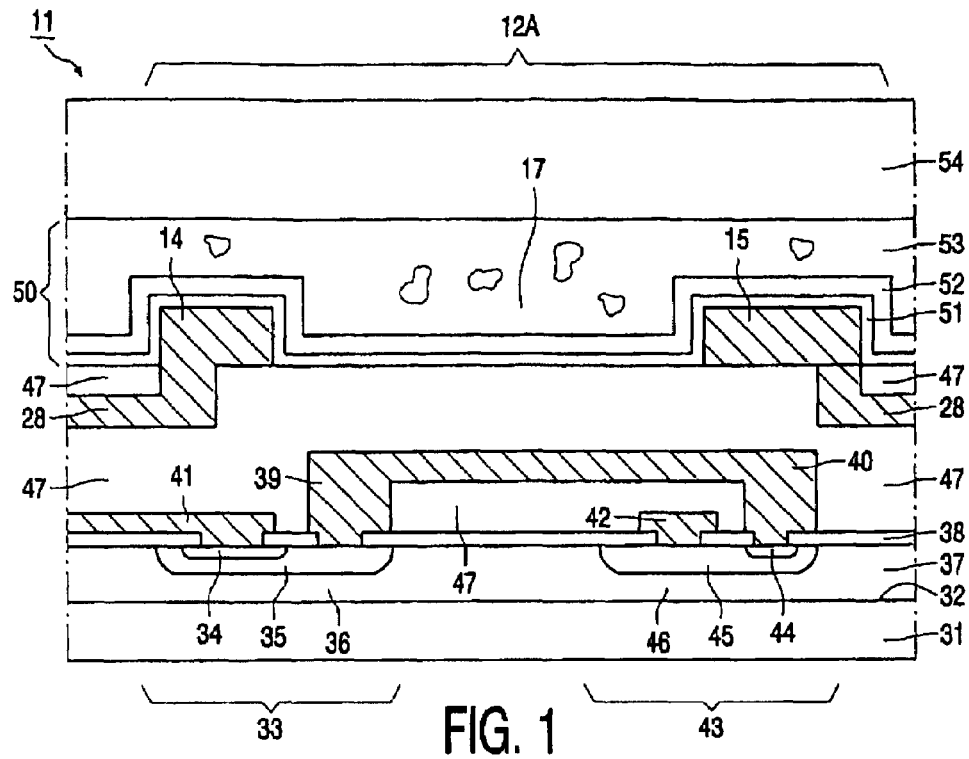
FIG. 1 shows a diagrammatic cross-sectional view of a first embodiment of the semiconductor device.

In FIG. 1 the semiconductor device 11 has a substrate 31 of silicon having a—first—side 32. On this side 32, the device 11 is provided with a first active element 33 and a second active element 43. These active elements 33, 43 are, in this example, bipolar transistors with emitter regions 34, 44, base regions 35, 45 and collector regions 36,46.

Said regions 34-36, 44-46 are provided in a first layer 37, which is covered with a patterned insulating layer 38 of silicon oxide. The insulating layer 38 is patterned such that it has contact windows at the emitter regions 34, 44 and the base regions 35, 45. As is known to those skilled in the art, field effect transistors can be present instead of or in addition to the bipolar transistor. As is further known to those skilled in the art, other elements, such as capacitors, resistors and diodes can be integrated in the semiconductor device 11.

At these contact windows in the insulating layer 38, the said regions are connected to interconnects 39, 40, 41, 42. The interconnects in this embodiment extend on a first level and a second level. As is generally known, the interconnect structure may contain more levels. Between the interconnects and the active elements a barrier layer not shown is generally present. The interconnects 39, 40,41,42 are manufactured, for example from Al or Cu, in a known manner and are covered and mutually insulated by dielectric layers 47, that preferably have a low dielectric constant. Addtionally present barrier layers are not shown. In between these dielectric layers 47 another metal layer 28 is present. In this metal layer 28 the input 14 and output 15 of the first security element 12A are defined at a mutual distance of 4 μm. The first security element further comprises a dielectric 17, that is constituted as a local area of the protecting structure 50, which in this example is the passivation structure as well. This passivation structure contains, in this embodiment, an adhesion layer 51 of Phosphorous silicate mass in a thickness of 0.50 μm, a passivating layer 52 of SiN in a thickness of 0.60 μm and a security layer 53 of moncaluminumphosphate in a thickness of 3.0 μm. This layer was applied by spin coating a composition of 15% by weight monoaluminumphosphate, 20-50% by weight of particles in water, and subsequent drying at about 100-150° C. Alternatively, it can be applied by spray coating a composition of 5-10% by weight monoaluminumphosphate. After drying, the layer is annealed at 400-500° C. to allow condensation, due to which a transition from the fluid to the solid phase takes place. The security layer 53 has been planarized and an epoxy material is present thereon as a package 54. The security layer 53 may be patterned, so as to define contact pads for connection to a PCB for example.

The particles contained in the security layer 53 are $TiO_2$, TiN, $SrTiO_3$ and/or modified $BaTiO_3$. Such modified $BaTiO_3$ is for example disclosed in U.S. Pat. No. 6,078,494. Relative dielectric constants and conductivities of these particles and the other materials in the passivation structure 50 are shown in Table 1.

The magnetic particles are preferably ferrites. Ferrite powders with a desired magnetic permeability are commercially available. The magnetic permeability is dependent on the material and on the frequency of use.

TABLE 1 relative dielectric constants (relative to that of a vacuum) and conductivities of several materials which may be present in the passivation structure

| type of action: | compound: | dielectric constant ($\epsilon_r$): | Conductivity (μΩ cm) | initial magnetic permeability |
|---|---|---|---|---|
| Dielectric | SiN | 8 | | |
| Dielectric | Phosphorous silicate glass | 4.2 | | |
| Dielectric | monoaluminum phosphate | 5 | — | |
| Dielectric | air | ~1 | — | |
| Dielectric | $SiO_2$ | 4.2 | | |
| Dielectric | mesoporous methyl substituted $SiO_2$ | 1.9-2.3 | | |
| Conductive | TiN | — | 21.7 | |
| Conductive | C (graphite) | — | 65 | |
| Dielectric | $TiO_2$ | ~100 | — | |
| Dielectric (ferroelectric) | $SrTiO_3$ | ~300-400 | — | |
| Dielectric | modified $BaTiO_3$ | ~25,000 | | |
| Magnetic | MnZn ferrite | | | 10-2000 |
| | $BaFe_{12}O_{19}$ | | | 0-8 |
| | NiZn ferrite | | | 100-10000 |

Figure 2:
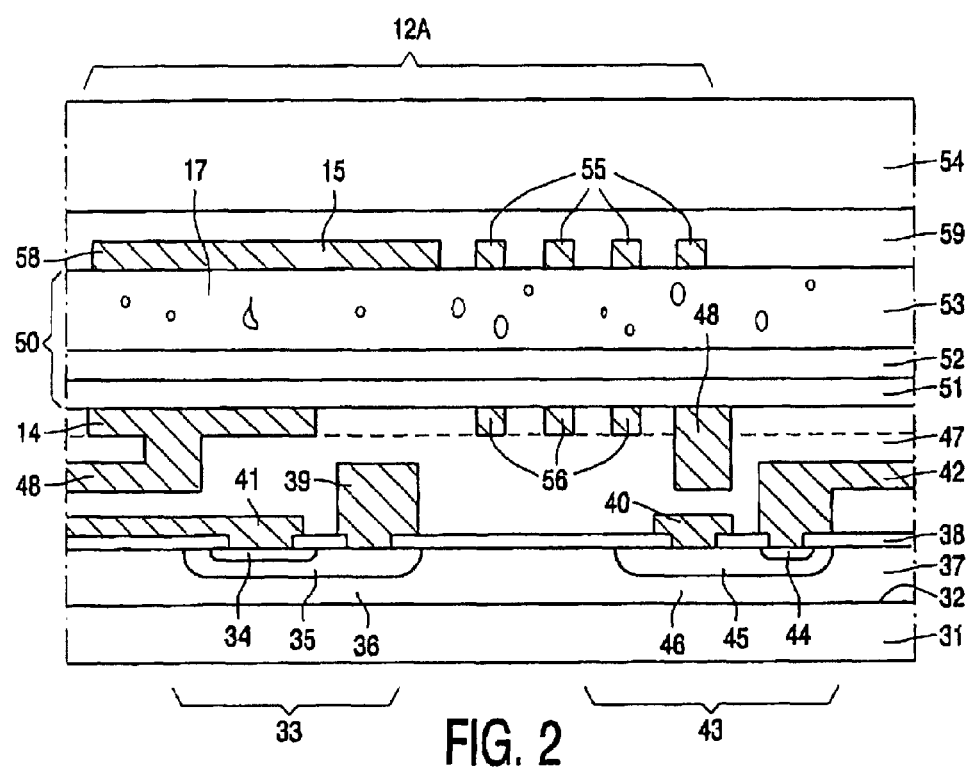
FIG. 2 shows a diagrammatic cross-sectional view of a second embodiment of the semiconductor device.

FIG. 2 shows a second embodiment of the semiconductor device 11 of the invention. In the device 11 of this embodiment the first security element 12A is an LC-structure which comprises a capacitor with input 14, output 15 and dielectric 17, and a coil with two windings 55, 56. Contrarily to the embodiment of FIG. 1 the input and output 14,15 are not present in the same layer on the same side of the passivation structure 50. The input 14 and the second winding 56 are present in the metal layer 28 between the passivation structure 50 and the active elements 33, 43. Each is connected to further circuitry through interconnects 48. The output 15 and the first winding 55, which are inter connected, are present in an additional metal layer 58 between the passivation structure 50 and the package 54. The additional metal layer 58 is protected against the package 54 through an additional passivating layer 59.

Figure 3:
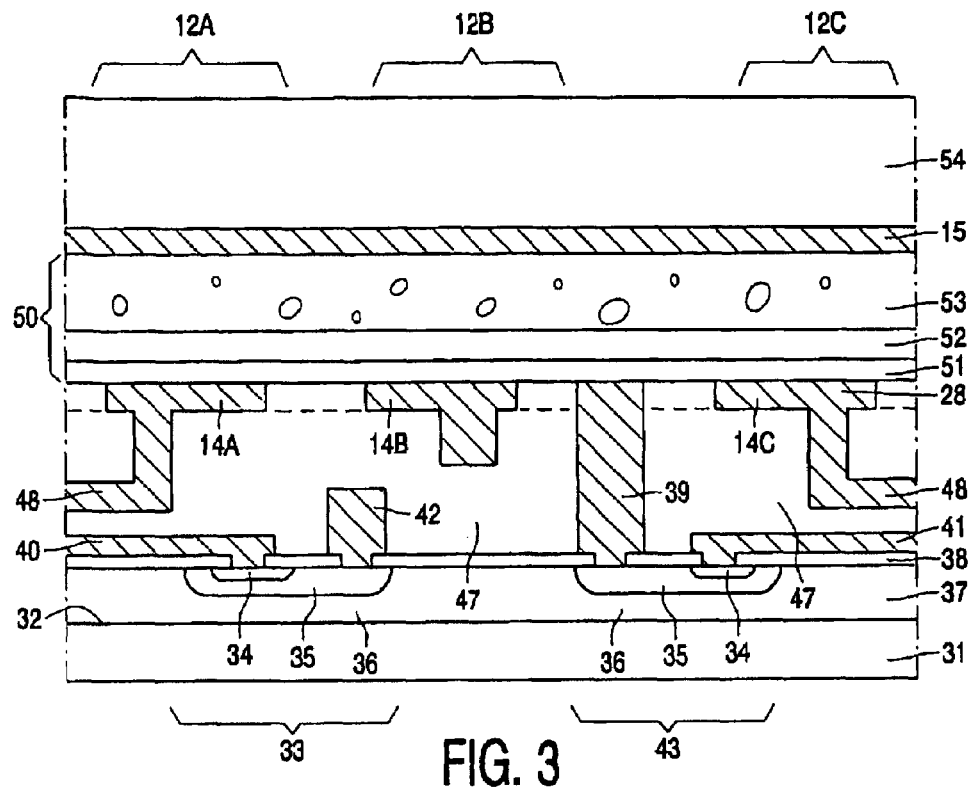
FIG. 3 shows a diagrammatic cross-sectional view of a third embodiment of the semiconductor device.

FIG. 3 shows a third embodiment of the semiconductor device 11 of the invention. The device 11 of this embodiment comprises a first security element 12A, a second security element 12B and a third security element 12C. All of these security elements 12A, 12B, 12C are capacitors with a common output 15, that is connected to a ground plane. The security elements 12A, 12B, 12C have different inputs 14A, 14B, 14C. These can be integrated very well in an array. It will be understood that input 14 and output 15 can be used reversely as well, particularly in the case of the use of alternating current.

Figure 4:
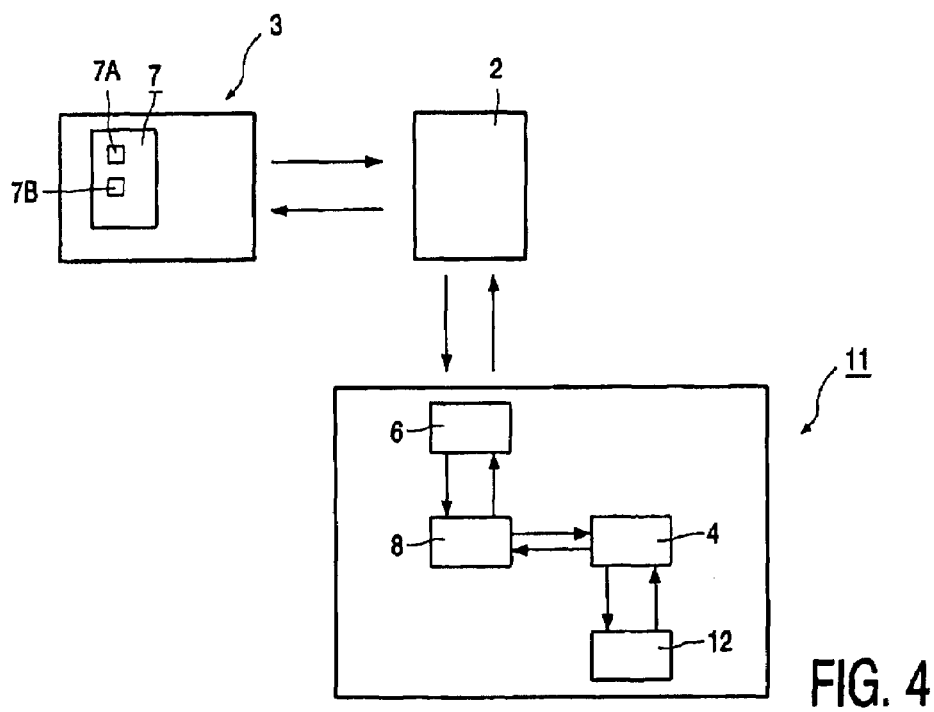
FIG. 4 is a schematic diagram of the system.

FIG. 4 shows a schematic diagram of an embodiment of the semiconductor device 11 together with an access device 2. The semiconductor device 11 comprises measuring means 4, processing means 8 and connection means 6. Furthermore, the semiconductor device comprises a plurality of security elements 12. The processing means 8 may be included in a controlling part for the complete semiconductor device 11, which for instance includes a memory with financial or identification data. The security elements 12 are, in this example, capacitors and are connected on one side to a ground plane.

In electronic payment applications the access device 2 may be a card reader, but in general, it may be any device, for instance an apparatus with which the initialization is effected. It comprises or is connected to a central database device 3. Alternatively, a subset of the first informations and the corresponding reference informations may be stored at a local memory. This central database device 3 contains a memory 7. The memory is of the conventional type and comprises read and storage control for reading and storing. In order to compare any second information with the reference information, a verification control 9 is present. The central database device 3 may be provided with error correction functions.

The circuit in the semiconductor device 11 functions as follows: a signal incorporating first information is sent from the access device 2 to the semiconductor device 11. This signal enters the processing means 8, in which the first information is converted into a program of measurement. The processing means 8 will send this program as a list of consecutive signals to the measuring means 4, indicating that the security elements 12 must be measured in the order and under the conditions as specified in the program of measurement. The measuring means 4, comprising any switching unit, ensure that the security elements are measured in an order prescribed by the signal sent and under physical conditions as prescribed.

After measuring the actual value of the first impedance, it may be stored in a temporal memory in the processing means 8. After measurement of the actual values according to the program, these actual values are converted to second information. This second information may be a list of the actual values as measured. More preferably, it is a transformed version of the actual values as measured. The transformation can be prescribed in the first information, or it can be embedded in the processing means 8 as a program. The transformation may include any conventional encryption. Preferably, a number of hash functions is used. These hash functions can be embedded in the memory of the integrated circuit on initialization.

The access device 2 will provide the second information being a transformation or list of a number of actual values to the central database unit 3. Here a comparison will be made between this second information and the reference information. On comparing the second information and the reference information the authenticity or the identity of the semiconductor device 11 will be recognized only if the difference between both values is smaller than a predefined threshold value, for instance 3%. The predefined threshold value will be dependent on the precision of the measuring means. It could be 10 or 20% as well, especially if the number of security elements is large, for instance 10 or more. It could be less than 1% as well. Preferably, error correction mechanisms are used so as to generate digitized values for the actual values, so as to reduce the threshold value.

Figure 5:
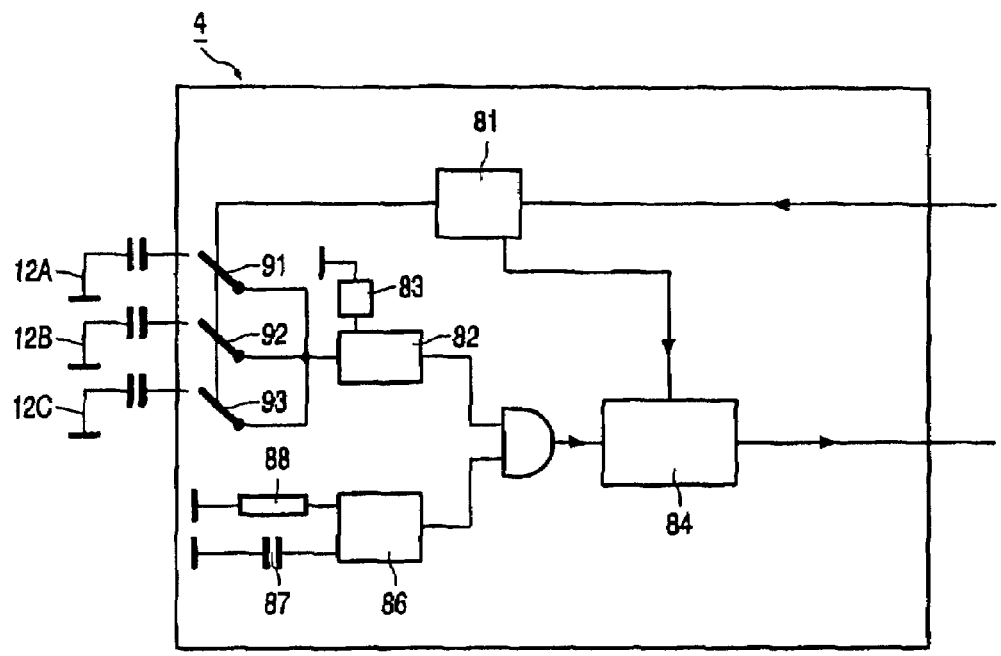
FIG. 5 shows an embodiment of the measuring means of the semiconductor device.

FIG. 5 shows a first embodiment of the measuring means 4 of the semiconductor device 11. The security elements 12A, 12B and 12C are shown as well. The measuring means 4 of this embodiment measure the imaginary part of the impedance of the security elements 12. In fact, the oscillator 82 provides a signal to the counter 84, which frequency depends on that imaginary part of the measured security element 12. The counter 84 compares this frequency to a signal having a clock frequency. This signal originates from oscillator 86 with capacitor 87 and resistor 88, that both have a precise and well-known value. The result of the comparison in the— binary—counter 84 is a digitalized signal which can be stored. The digitalized signal is the actual value of the impedance of the measured security element 12. The actual value may be present in any kind of SI-units, but also in any semiconductor specific value, as it will not be compared with any externally measured value. In order to select which security element 12A, 12B, 12C is to be measured, a selection unit 81 is present. It will send signals such that one of the switches 91, 92, 93 is on, and one of the security elements 12A, 12B, 12C is measured. The switches are preferably transistors. Alternatively, a desired combination of security elements 12 can be measured, so as to minimize the measuring steps or complicate the security. Said simultaneous multiple measuring is understood in the context of this application as measuring the actual value of the first security element 12A. The selection unit also provides a signal to the counter 84 after a measuring step, so as to clear its result.

The selection unit 81 may be part of the control means 8. Furthermore, the oscillator 86 may be embodied so as to be the clock generator of the semiconductor device 11. In that case, it can be absent from the measuring means 4 and its signal may be sent to the counter 84 via the control means 8. In order to obtain actual and reference values that are precise enough, i.e. that the difference between them is lower than a threshold value of 3-5%, the oscillators 82, 86 are adjusted such as to be correct within about 1%. This is done in the usual way, as known to the skilled person, and preferably by the provision of an adequate design.

It is preferred that the security element 12C is a reference element, of which the actual value is known. This can be realized for example by implementing the element 12C in the interconnect structure; this is especially so in the case that the passivation structure 50 contains a security layer 53 with particles that are distributed inhomogeneously. This reference security element 12C can be used to optimize the measuring results, and if necessary to deduct actual values from the results of the binary counter 84.

Figure 6:
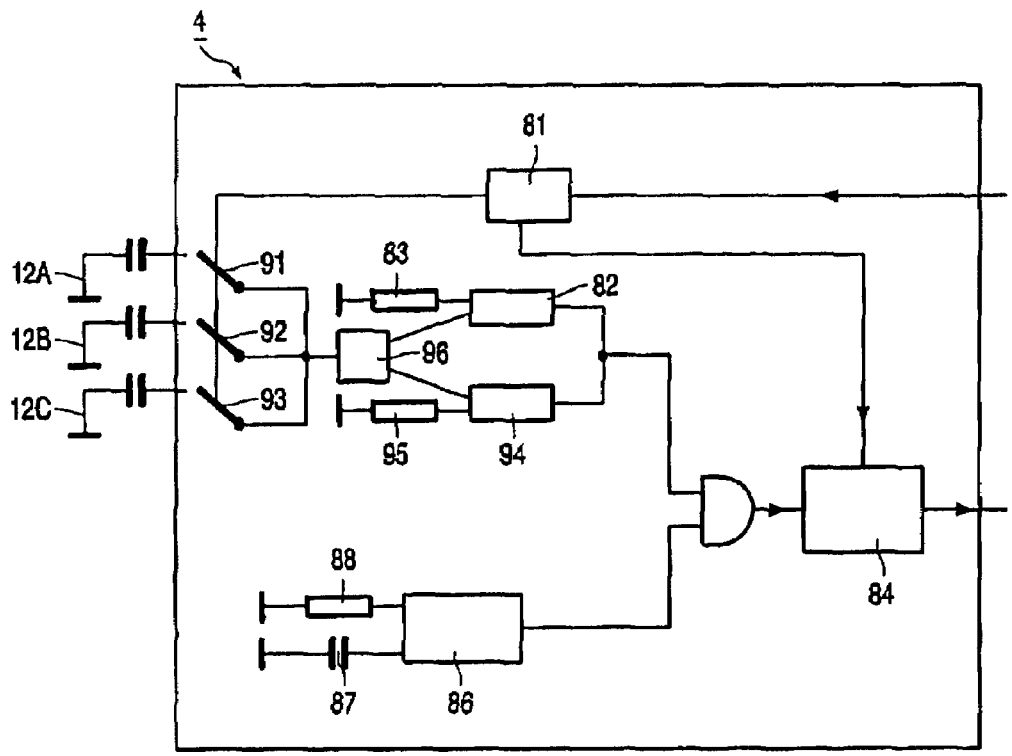
FIG. 6 shows another embodiment of the measuring means of the semiconductor device.

FIG. 6 shows a second embodiment of the measuring means 4 of the semiconductor device 11, which is largely identical to the first embodiment. In this case a second oscillator 94 with resistor 95 is provided, as well as a switch 96. In this case the selection unit 81 does not only select the security element 12A, 12B, 12C that is to be measured. It also selects the oscillator 82, 94 with which the security element 12A, 12B, 12C is to measured. As the oscillators 82, 94 will be scaled differently, their frequencies will differ. Hence, the embodiment allows the impedance to be measured at two frequencies. Both of the resulting actual values may be transferred to the access device 2. It may be that these values are mutually compared in a comparator that is placed functionally behind the binary counter 84.

In short, the semiconductor device (11) of the invention comprises a circuit and a protecting structure (50). It is provided with a first and a second security element (12A, 12B) and with an input and an output (14,15). The security elements (12A,12B) have a first and a second impedance, respectively, which impedances differ. The device is further provided with measuring means, processing means and connection means. The processing means transform any first information received into a specific program of measurement. Herewith a challenge-response mechanism is implemented in the device (11).

We claim:

1. A semiconductor device provided with a circuit comprising an active element, and with a protecting structure, which semiconductor device is further provided with:
   a first and a second security element each comprising a local area of the protecting structure and an input and an output, and having a first and a second impedance respectively,
   connection means for receival of first information from a reader and for transmittal of second information, measuring means to measure actual values of the first and second impedance in a manner established on the basis of the first information, and processing means to establish a program of measurement of the set of actual values of the security elements on the basis of the first information, and to transform the actual values as measured into the second information, wherein the second information is different from the actual values as measured.

2. A semiconductor device as claimed in claim 1, wherein the manner of measurement includes the determination of an order of measurement.

3. A semiconductor device as claimed in claim 1, wherein: the manner of measurement includes the determination of frequencies of measurement for the actual values of the first and second impedance to be measured, and the measuring means comprise a frequency setting circuit.

4. A semiconductor device as claimed in claim 1, wherein: the manner of measurement includes the determination of an external field strength, at which the actual values of the first and second impedance are to be measured, and the measuring means comprise a means to set the external field strength.

5. A semiconductor device as claimed in claim 1, wherein said processing means is further configured to perform a conversion treatment on the actual values as measured to generate the second information, wherein the performed conversion treatment is selected from the group consisting of:
    combining the actual values as measured by multiplication, addition, or subtraction;
    modifying an individual actual value as measured with a number, applying a hash function to the actual values as measured; and
    adding numbers to the actual values as measured.

6. A semiconductor device as claimed in claim 1, wherein the protecting structure has an effective dielectric constant that varies laterally over the circuit.

7. A semiconductor device as claimed in claim 1, wherein the protecting structure has an effective magnetic susceptibility that varies laterally over the circuit.

8. A semiconductor device as claimed in claim 6, wherein the protecting structure comprises a security layer that comprises particles that are distributed inhomogeneously over the circuit.

9. An apparatus comprising the semiconductor device according to claim 1.

10. A carrier comprising the semiconductor device according to claim 1.

11. A semiconductor device as claimed in claim 5, wherein said processing means is further configured to perform the conversion treatment on the actual values as measured to generate the second information in a manner established on the basis of the first information.

12. A semiconductor device as claimed in claim 1, wherein said processing means is further configured to transform the actual values as measured into the second information in a manner established on the basis of the first information.

13. A semiconductor device as claimed in claim 1, wherein the processing means are provided with at least one hash function, that is to be applied to the first information at the establishment of the program of measurement.

14. A method of checking the authenticity or establishing the identity of a semiconductor device by a reader, which comprises or has access to a memory comprising reference information generated through an initial measurement of security elements of the semiconductor device, which device comprises: a first and a second security element each comprising a local area of the protecting structure and an input and an output, and having a first and a second impedance respectively, connection means for receival of first information from a reader and for transmittal of second information, measuring means to measure actual values of the first and second impedance in a manner established on the basis of the first information, and processing means to establish a program of measurement of the set of actual values of the security elements on the basis of the first information, and to transform the actual values as measured into the second information, wherein the second information is different from the actual values as measured, which method comprises the steps of
    providing first information comprising instructions to measure actual values of the security elements in a specific manner;
    transmitting said first information from the reader to the semiconductor device;
    establishing a program of measurement of a set of actual values of the security elements on the basis of the first information, wherein establishing the program of measurement includes performing at least one hash function to the first information;
    measuring the actual values of the security elements according to the program of measurement;
    transforming the actual values as measured into the second information, wherein the second information is different from the actual values as measured;
    transmitting the second information from the semiconductor device to the reader,
    checking the authenticity or establishing the identity by comparison of the second information with reference information, said comparison taking place with the reference information and/or the second information in comparable formats, and
    recognizing the authenticity or the identity only if the difference between at least a number of elements included in the second information and in the reference information in their comparable formats is smaller than a prescribed threshold value.

15. A method as claimed in claim 14, wherein the first information comprises instructions to measure actual values of a security element under specific physical conditions.

16. A method as claimed in claim 14, wherein the manner established on the basis of the first information includes the determination of an order of measurement.

17. A system of a semiconductor device and a reader that comprises or has access to a memory comprising reference values of the security elements of the semiconductor device, which semiconductor device comprises:
    a first and a second security element each comprising a local area of the protecting structure and an input and an output, and having a first and a second impedance respectively,
    connection means for receival of first information from a reader and for transmittal of second information,
    measuring means to measure actual values of the first and second impedance in a manner established on the basis of the first information, and
    processing means to establish a program of measurement of the set of actual values of the security elements on the basis of the first information, and to transform the actual values as measured into the second information, wherein the second information is different from the actual values as measured.

18. A method of initializing a semiconductor device for use in a system as claimed in claim 17, in which method an initialization reader is used, which method comprises the steps of providing first information comprising instructions to measure actual values of the security elements in a specific manner;

transmitting said first information from the reader to the semiconductor device;

establishing a program of measurement of a set of actual values of the security elements on the basis of the first information;

measuring the actual values of the security elements according to the program of measurement;

transforming the actual values as measured into the second information, wherein the second information is different from the actual values as measured;

transmitting the second information from the semiconductor device to the reader, storing the second information as reference information in a memory of the initialization reader or in a memory connected to the initialization reader.

19. A system as claimed in claim 17, wherein the manner established on the basis of the first information includes the determination of an order of measurement.

20. A system as claimed in claim 17, wherein the processing means are provided with at least one hash function, that is to be applied to the first information at the establishment of the program of measurement.

* * * * *